United States Patent
Montgomery et al.

(10) Patent No.: US 6,605,394 B2
(45) Date of Patent: Aug. 12, 2003

(54) ORGANIC BOTTOM ANTIREFLECTIVE COATING FOR HIGH PERFORMANCE MASK MAKING USING OPTICAL IMAGING

(75) Inventors: Melvin W. Montgomery, Camas, WA (US); Jeffrey A Albelo, Hillsboro, OR (US)

(73) Assignee: Applied Materials, Inc., Santa Clara, CA (US)

(*) Notice: Subject to any disclaimer, the term of this patent is extended or adjusted under 35 U.S.C. 154(b) by 11 days.

(21) Appl. No.: 09/848,859

(22) Filed: May 3, 2001

(65) Prior Publication Data

US 2002/0182514 A1 Dec. 5, 2002

(51) Int. Cl.[7] .............................. G03F 9/00; G03C 5/00
(52) U.S. Cl. .......................................... 430/5; 430/296
(58) Field of Search ........................ 430/5, 270.1, 510, 430/296; 250/492.1; 378/34, 35

(56) References Cited

U.S. PATENT DOCUMENTS

| | | | |
|---|---|---|---|
| 4,102,683 A | 7/1978 | DiPiazza | 96/38.4 |
| 4,357,416 A | 11/1982 | Fan | 430/302 |
| 5,109,149 A | * 4/1992 | Leung | 219/121.69 |
| 5,234,990 A | 8/1993 | Flaim et al. | 524/609 |
| 5,272,042 A | 12/1993 | Allen et al. | 430/270 |
| 5,278,010 A | 1/1994 | Day et al. | 430/18 |
| 5,759,724 A | * 6/1998 | Rolson | 430/5 |
| 5,879,863 A | 3/1999 | Azuma et al. | 430/322 |
| 5,939,236 A | 8/1999 | Pavelchek et al. | 430/273.1 |
| 6,033,721 A | 3/2000 | Nassuphis | 427/10 |
| 6,048,672 A | 4/2000 | Cameron et al. | 430/327 |
| 6,156,479 A | 12/2000 | Meador et al. | 430/270.1 |
| 6,169,029 B1 | * 1/2001 | Yang | 438/671 |
| 6,376,984 B1 | * 4/2002 | Fernandez et al. | 313/530 |
| 6,406,831 B1 | * 6/2002 | Yamana | 430/270.1 |

FOREIGN PATENT DOCUMENTS

| | | | |
|---|---|---|---|
| EP | 0 588 087 A2 | 8/1993 | H01L/21/027 |
| EP | 0905565 A1 | 3/1999 | G03F/7/09 |
| EP | 0987600 A1 | 3/2000 | G03F/7/09 |
| EP | 0989460 A1 | 3/2000 | G03F/7/004 |
| GB | 2349148 A | 10/2000 | C07C/69/54 |
| JP | 10048831 | 2/1998 | G03F/7/11 |
| JP | 10048832 | 2/1998 | G03F/7/11 |
| WO | WO 00/54105 | 9/2000 | G03C/1/492 |

OTHER PUBLICATIONS

Gilles Amblard et al., "Diffusion Phenomenon and Loss of Adhesion in Chemically Amplified Negative Resists", Microelectronic Engineering vol. 17 (1992) pp. 275–278.

Kohji Katoh et al., "Improvement of Post Exposure Delay Stability of Chemically Amplified Positive Resist", SPIE vol. 3748 0277–786X/99.

Uzodinma Okoroanyanwu et al., "Impact of Optical Absorption on Process Control for Sub–0.15–$\mu$m Device Patterning Using 193–nm Lithography", SPIE vol. 3998 (2000) 0277–786X/00.

Choi Pheng Soo et al., "Enhancement or Reduction of Catalytic Dissolution Reaction in Chemically Amplified Resists by Substrate Contaminants", IEEE 0894–6507/99, IEEE 1999.

Copy of Search Report in corresponding PCT Application No. PCT/US 02/13968, mailed Sep. 9, 2002.

* cited by examiner

Primary Examiner—S. Rosasco
(74) Attorney, Agent, or Firm—Shirley L. Church (57) ABSTRACT

The disclosure pertains to a method of optically fabricating a photomask using a direct write continuous wave laser, comprising a series of steps including applying an organic antireflection coating over a chrome-containing layer; applying a chemically-amplified DUV photoresist over the organic antireflection coating; and exposing a surface of the DUV photoresist to the direct write continuous wave laser. The direct write continuous wave laser operates at a wavelength of 244 nm or 257 nm. In an alternative embodiment, the organic antireflection coating may be applied over an inorganic antireflection coating which overlies the chrome containing layer.

13 Claims, 5 Drawing Sheets

ORGANIC BOTTOM ANTIREFLECTIVE COATING FOR HIGH PERFORMANCE MASK MAKING USING OPTICAL IMAGING

BACKGROUND OF THE INVENTION

1. Field of the Invention

In general, the present invention relates to a method of producing a lithographic mask (reticle) for use in the semiconductor industry. In particular, the invention pertains to the use of a deep ultraviolet (DUV) photoresist in combination with at least one antireflective coating (ARC) to produce a high performance mask. The invention also relates to use of an optical direct write continuous laser mask writing tool in combination with a chemically amplified DUV photoresist and an organic ARC.

2. Brief Description of the Background Art

Photoresist compositions are used in microlithographic processes for making miniaturized electronic components, such as in the fabrication of semiconductor device structures. The miniaturized electronic device structure patterns are typically created by transferring a pattern from a patterned masking layer overlying the semiconductor substrate rather than by direct write on the semiconductor substrate, because of the time economy which can be achieved by blanket processing through a patterned masking layer. With regard to semiconductor device processing, the patterned masking layer may be a patterned photoresist layer or may be a patterned "hard" masking layer (typically an inorganic material or a high temperature organic material) which resides on the surface of the semiconductor device structure to be patterned. The patterned masking layer is typically created using another mask which is frequently referred to as a photomask or reticle. A reticle is typically a thin layer of a metal-containing layer (such as a chrome-containing, molybdenum-containing, or tungsten-containing material, for example) deposited on a glass or quartz plate. The reticle is patterned to contain a "hard copy" of the individual device structure pattern to be recreated on the masking layer overlying a semiconductor structure.

A reticle may be created by a number of different techniques, depending on the method of writing the pattern on the reticle. Due to the dimensional requirements of today's semiconductor structures, the writing method is generally with a laser or e-beam. A typical process for forming a reticle may include: providing a glass or quartz plate, depositing a chrome-containing layer on the glass or quartz surface, depositing an antireflective coating (ARC) over the chrome-containing layer, applying a photoresist layer over the ARC layer, direct writing on the photoresist layer to form a desired pattern, developing the pattern in the photoresist layer, etching the pattern into the chrome layer, and removing the residual photoresist layer. When the area of the photoresist layer contacted by the writing radiation becomes easier to remove during development, the photoresist is referred to as a positive-working photoresist. When the area of the photoresist layer contacted by the writing radiation becomes more difficult to remove during development, the photoresist is referred to as a negative-working photoresist. Advanced reticle manufacturing materials frequently include combinations of layers of materials selected from chromium, chromium oxide, chromium oxynitride, molybdenum, molybdenum silicide, and molybdenum tungsten silicide, for example.

As previously mentioned, the reticle or photomask is used to transfer a pattern to an underlying photoresist, where the reticle is exposed to blanket radiation which passes through open areas of the reticle onto the surface of the photoresist. The photoresist is then developed and used to transfer the pattern to an underlying semiconductor structure. Due to present day pattern dimensional requirements, which are commonly less than 0.3 $\mu$m, the photoresist is preferably a chemically amplified DUV photoresist. In the making of the reticle itself, a chemically amplified DUV photoresist has been used in combination with a direct write electron beam writing tool. However, the exposed, imaged photoresist on the surface of the unpatterned reticle frequently exhibits a "foot" at the bottom of the pattern profile, where the photoresist layer interfaces with an underlying ARC layer on a chrome-containing surface, for example, despite the presence of the underlying ARC layer (which is typically a chrome oxynitride material). The foot is not uniform in size across the reticle substrate surface because the basisity changes somewhat randomly across the substrate surface. Since the foot is variable, it makes it difficult to do the metrology which is used to determine whether the finished reticle will meet dimensional requirements. Some imaged and developed positive tone photoresists exhibit a "t"-top profile. In addition, the surface of the patterned photoresist layer typically exhibits standing waves, due to reflections which occur during the direct writing on the photoresist layer, despite the presence of the underlying ARC layer.

In their 1992 paper in Microelectronic Engineering (Vol. 17 (1992) 275–278), Gilles Amblard et al. describe how the development of chemically amplified (CA) resist systems has been the most successful approach to meeting the challenge of high resolution and high speed, posed by X-Ray, Electron-Beam or Deep UV lithography. However, they discovered that pattern profile abnormalities appear which limit the use of a negative resist. Even though the correct exposure dose is applied throughout the thickness of the desired pattern, an aqueous developer dissolves the bottom part of the resist in contact with or near the underlying substrate. Fissures as thick as 0.1 to 0.2 $\mu$m were observed in the pattern at the interface with the substrate, resulting in a loss of adhesion in fine patterns. The problem was observed for resists imaged and developed on both spin on glass (SOG) and aluminum substrates. With regard to the aluminum, they observed that because of the amphoteric behavior of aluminum, the acid molecules of the photoresist react when they come in contact with the substrate, thus generating a concentration gradient within the resist material. Because of the lack of acid molecules near the resist/aluminum interface, crosslinking of the resist could not be achieved, and the unreacted resist was washed away during development. A recommended method of overcoming this problem, for a Shipley SAL 603 photoresist imaged using an Electron-beam 20 KeV, is to deposit a layer of $Al_2O_3$ or titanium over the aluminum substrate prior to applying the photoresist.

Japanese Patent No. 10048831 assigned to Sony Corp and granted Feb. 20, 1998, relates to patterning of a chemical amplification-based resist film on a film which is to be patterned. The composition of the film to be patterned is not specified in the English abstract of the Japanese patent. The formation process comprises: (a) covering the film to be patterned with a protective coating consisting of chalcogen except sulphur; (b) depositing the chemical amplification-based resist film on the protective coating; (c) applying selective exposure, baking after exposure, and development to the chemical amplification-based resist film to form a resist pattern; and (d) selectively removing the exposed portion of the protective coating. The advantage is said to be that the surface of the film to be patterned is previously passivated by the protective coating. This prevents diffusion of active species between the chemical amplification-based resist film and the film to be patterned and prevents the active species from a decrease in its concentration around the interface against the film to be patterned. The resulting resist pattern is said to have "no unusual shape".

International Application WO99/53378 of S. Funato et al., assigned to Clariant Int. Ltd., published Oct. 21, 1999, describes a method of forming a pattern in a photosensitive film made from a chemical amplification resist material. The method is said to provide high resolution and high precision by preventing reaction products from being formed at the interface between an anitreflection film and a photosensitive material film. This is accomplished by decreasing residuals of the etched film after etching. A film is formed on a semiconductor substrate (which is polysilicon). The film is a photosensitive material made of a chemical amplification resist material containing an onium salt compound and at least either a sulfone compound or a sulfonate. The photosensitive material film is exposed to light through a mask and is developed to form a patterned resist film. Subsequently, the antireflection film is dry etched using an $SO_2$—$O_2$ gas mixture and the polysilicon is dry etched using the patterned resist film.

European Patent Application EP 0 905 565 A1 of Lu Zhijian, assigned to Siemens Aktiengesellschaft, published Mar. 31, 1999, discloses a method for making an antireflective layer for improving photoresist resolution and process window. The method includes providing a first volume of an organic anti-reflective chemical and providing a second volume of photo-acid generator chemical. The second volume is between about 0.01 percent and about 30 percent of the first volume. The first volume of organic anti-reflective chemical and the second volume of photo-acid generator chemical are then mixed substantially simultaneously to produce an enhanced anti-reflective chemical which will provide an increased level of acid under exposed photoresist regions. The increase in level of acid in the enhanced anti-reflective chemical is said to minimize the effects of acid loss from a subsequently spin-coated deep ultra-violet photoresist layer at the interface with the anti-reflective coating. The enhanced anti-reflective layer is applied over a semiconductor substrate where the exposed surface may be a dielectric layer, aluminum, copper, or polysilicon. An example given for the photo-acid generator is a diphenyliodonium salt. After application of a DUV photoresist over the enhanced anti-reflective layer, the wafer is subjected to a post-apply bake to drive off solvent and harden the photoresist. The photoresist is exposed to DUV wavelength light (e.g., 248 nm or 193 nm) through a reticle which includes the pattern to be transferred.

U.S. Pat. No. 5,879,863 to Azuma et al., issued Mar. 9, 1999, discloses a method of forming a pattern on a semiconductor substrate which includes forming a film on a semiconductor substrate; bringing a vapor of a first neutralizer into contact with the surface of the film, to form a primer layer of the first neutralizer on the film, where the first neutralizer generates an acid on exposure to light which neutralizes a base species; applying a chemical amplification resist over the primer layer; and selectively exposing the resist layer to light, followed by developing the resist pattern. This method is said to be effective when the film is formed of a material containing a base species. Examples are borophospho silicate glass film or titanium nitride film. An example of the first neutralizer is 2-sulfonyl butane or methyl methacrylate. The chemical amplification resist is said to be a positive resist. In the alternative, when the film to be patterned is acidic, the first neutralizer generates a nucleophile upon exposure to light to neutralize an acid species, or the first neutralizer is weakly basic and neutralizes an acid species by itself. An example of the first neutralizer is acrylamide or pyridine.

U.S. Pat. No. 5,939,236 of Pavelcheck et al, assigned to Shipley Company, L.L.C., issued Aug. 17, 1999, describes a light absorbing crosslinking composition suitable for use as an antireflective composition, particularly for deep UV applications. The antireflective compositions include a photoacid generator that is activated during exposure of an overcoated photoresist. The antireflective composition is said to include a resin binder, an acid or thermal acid generator, and a photoacid generator compound. Antireflective compositions of the invention are said to significantly reduce undesired footing of an overcoated resist relief image. The photoresist is used to transfer an image to a substrate which is exposed through a photomask.

In their paper entitled: "Improvement of Post Exposure Delay Stability Of Chemically Amplified Positive Resist", presented at the SPIE Symposium on Photomask and X-Ray Technology VI, Yokohama Japan, September 1999 (SPIE) Vol. 3748. 0277786X/99, Kohji Katoh et al. describe the development of a novolak-based chemically amplified positive resist for next generation photomask (below 0.18 $\mu$m) fabrication. The resist is said to prevent footing profile by the use of a hydrophilic polyphenol compound. The resist was used to make a well defined 0.25 $\mu$m line-and-space pattern on a $CrO_x$ substrate at a dose of 4.0 $\mu C/cm^2$. The advanced high acceleration voltage (50 kV) E-beam writer HL-800M was developed to provide better critical dimension control. However, the high acceleration voltage lowers the sensitivity of resists. To compensate, a chemically amplified resist was needed. The resist developed includes four components: a novolak matrix resin, a polyphenol compound, an acid generator, and a dissolution inhibitor.

In their paper "Enhancement or Reduction of Catalytic Dissolution Reaction in Chemically Amplified Resists by Substrate Contaminants" (published in IEEE Transactions On Semiconductor Manufacturing, Vol. 12, No. 4, November 1999), Choi Pheng Soo et al. describe the chemical interaction of resist and substrate at the interface, which modifies the dissolution reaction, and has degraded sidewall profile of the resist features. Depending on the nature of the residue on the substrate, the "bottom pinching" (BP) effect and footing are observed, especially for negative chemically amplified (CA) resists. The BP effect is observed for CA resist on top of an organic bottom antireflection coating (BARC). The BP is attributed to the acid generated from the underlying organic BARC. With optimization on soft bake temperature of BARC, the BP effect is said to be eliminated. On a silicon nitride surface, new chemical information is said to have explained "footing" and BP effects in CA resists. Residual alkaline molecules on the nitride surface are said to play a major role in the formation of footing for a positive tone resist and pinching for a negative tone resist. Less severe footing is said to be observed if the nitride surface is plasma-deposited with a thin oxide cap, which suppresses the surface basicity. However, extended plasma deposition is said to cause surface acidity of a newly formed oxide cap, so that the nitride surface becomes acidic, causing BP.

European Patent Application No. EP0 987 600 A1 of Timothy G. Adams et al., assigned to Shipley Company LLC, published Mar. 22, 2000, describes new light absorbing crosslinking compositions suitable for use as an antireflective composition (ARC), particularly suitable for short wavelength imaging applications such as 193 nm. The ARCs are preferably used with an overcoated resist layer (i.e., as bottom layer ARCs) and in general comprise ARC resin binders that can effectively absorb reflected sub-200 nm exposure radiation. In particular, the antireflective composition comprises a resin binder that has phenol groups. The phenol groups are described as directly pendant from the resin backbone of the antireflective composition resin.

International Patent Application PCT/US00/06314 of Patrick Foster et al., assigned to Arch Specialty Chemicals, Inc., published Sep. 14, 2000, describes the use of chemically amplified bilayer resist systems for deep UV lithography in semiconductor manufacturing. The problem with using deep UV wavelengths is said to be that resists used at the higher wavelengths were too absorbent and insensitive. Thus, in order to utilize deep UV light wavelengths, new resist materials with low optical absorption and enhanced sensitivities were needed. However, chemically amplified resist systems have many shortcomings. One problem is said to be standing wave effects, which occur when monochromatic deep UV light is reflected off the surface of a reflective substrate during exposure. The formation of standing waves in the resist reduces resolution and causes line width variations. Standing waves in a positive resist are said to have a tendency to result in a foot at the resist/substrate interface, reducing the resolution of the resist. In addition, chemically amplified resist profiles and resolution may change due to substrate poisoning. Particularly, this effect is said to occur when the substrate has a nitride layer. It is believed that the N—H bond in the nitride film deactivates the acid at the nitride/resist interface. For a positive resist, this results in an insoluble area, and either resist scumming, or a foot at the resist/substrate interface. Foster et al. recommend utilizing an underlayer or undercoat film that is placed on the substrate before the chemically amplified film is applied as a means of reducing the above-mentioned problems. A typical bilayer resist process provides for application of the undercoat layer on the substrate, with the chemically amplified resist being applied over the undercoat layer. The invention is said to be a thermally curable polymer composition comprising a hydroxyl-containing polymer, an amino cross-linking agent and a thermal acid generator. The hydroxyl-containing polymer is said to comprise monomer units selected from the group consisting of cyclohexanol, hydroxystyrene, hydroxyalkyl acrylate or methacrylate, hydroxycycloalkyl acrylate or methacrylate, hydroxyalkylcycloalkyl acrylate or methacrylate, arylalkyl alcohol, and allyl alcohol.

U.S. Pat. No. 6,156,479 to Meador et al., assigned to Brewer Science Inc., and issued Dec. 5, 2000 pertains to thermosetting anti-reflective coating compositions for use in multilayer photoresist systems. The anti-reflective coating compositions are said to have improved etch rate, and to be prepared from certain acrylic polymers and copolymers, such as, glycidyl methacrylate reacted with non-polycyclic carboxylic acid dyes and non-polycyclic phenolic dyes, all light absorbing at a wavelength of 193 nm. In describing the prior art, the inventors mention that previously described antireflective coatings may intermix with photoresists upon application of the photoresist, and, that this intermixing produces small but discernible distortions at the bottom of resist features. For feature sizes below 0.3 µm dimensions, even these small distortions become unacceptable for producing good quality, practical devices. Thermosetting anti-reflective coatings are said to be preferable, but may be difficult to etch, hampering their removal after development of an overlying DUV photoresist.

The above descriptions pertain to the use of chemically amplified photoresist on semiconductor substrates, or to the use of a chemically amplified photoresist in combination with electron beam lithography to produce a reticle. The present invention is different in that it pertains to the use of an optical system, a direct write continuous wave laser, to image a chemically amplified photoresist which is used to transfer a pattern to a photomask (reticle). However, many of the problems described above are experienced in producing a reticle using an optical imaging system in combination with a chemically amplified photoresist.

Figure 1A:
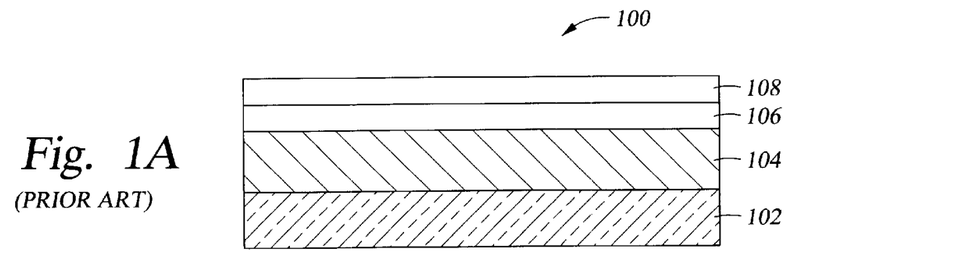
FIGS. 1A–1C illustrate problems encountered in the direct writing of a pattern into a photoresist material.
Figure 1B:
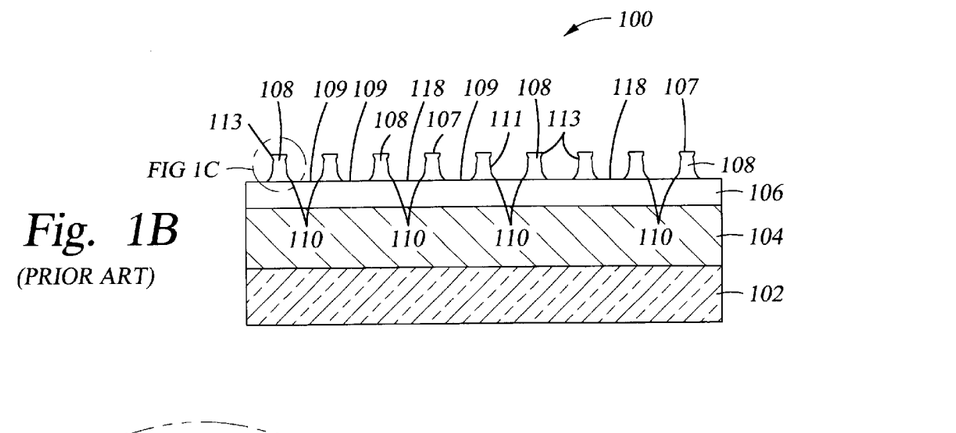
Figure 1C:
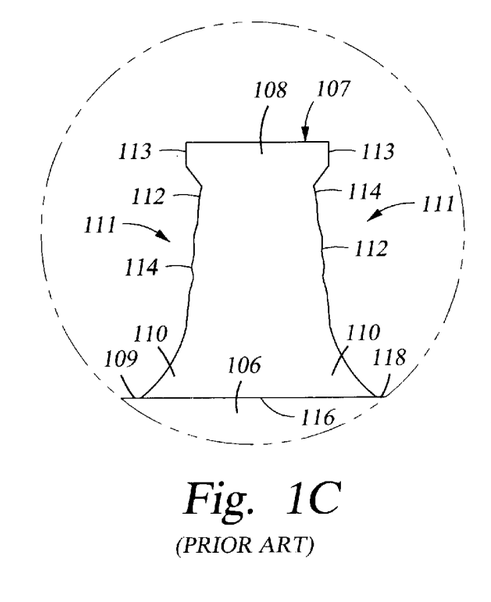

FIG. 1A shows a schematic of a cross-sectional view of a prior art starting structure 100 used to form a reticle, including, from bottom to top, a quartz substrate 102, overlaid with chrome-containing layer 104, overlaid with an ARC layer 106, and a positive tone photoresist layer 108. As shown in FIGS. 1B and 1C, after patterning of the photoresist layer 108 using an electron-beam writing tool, there is often a "foot" 110 extending from the lower portion of patterned photoresist layer 108 toward the surface 116 of ARC layer 106. The presence of a foot (feet) 110 makes it difficult to maintain control of the critical dimensions during subsequent etch transferring of the photoresist pattern through the ARC layer 106 and chrome containing layer 104. The foot also impacts the metrology capabilities of the lithographer.

FIG. 1C, which is an enlargement (from FIG. 1B) of a portion of the patterned photoresist layer 108 (with underlying ARC layer 106), shows a line 107 which exhibits "t"-topping 113 in the upper portion of line 107, feet 110 at the base of line 107, and ripples (standing waves) 114 on the sidewall 111 surfaces 112 of line 107. The "t"-topping 113 is believed to be caused by contamination/reaction which occurs at the upper surface of the photoresist layer during processing prior to development of the pattern. The standing waves 114 are generated by reflected radiation within the photoresist material, which occurs during the direct writing of the pattern into photoresist layer 108 by the electron-beam writing tool. The ARC layer 106 helps reduce the standing wave effect by reducing reflection back from underlying layers and device features into the photoresist layer 108, but standing waves are generated in varying degrees depending on the imaging system and the material composition of the particular photoresist. When the photoresist is a chemically amplified photoresist, transparency of the photoresist material is particularly high throughout the entire direct writing process; this results in increased reflectivity (greater than that for earlier i-line novolak photoresists), which increases the formation of standing waves 114.

Thus, it would be highly desirable to have a method of making a photomask which provides features having critical dimensions of 0.3 µm or less. To accomplish this, it is necessary to have a method of producing a patterned, developed photoresist which exhibits minimal surface distortions in the form of feet at the base, "t"-topping at the top of the resist, and standing waves along the sidewalls of the developed photoresist. This improved developed photoresist can be used to transfer the pattern for the feature to an underlying photomask (reticle).

SUMMARY OF THE INVENTION

One embodiment of the present invention pertains to a method of optically fabricating a photomask using a direct write continuous wave laser, which includes the steps of applying an organic antireflection coating over a metal-containing layer; applying a chemically-amplified DUV photoresist, either positive tone or negative tone, over the organic antireflection coating; and exposing a surface of the DUV photoresist to radiation from the direct write continuous wave laser. Preferably the laser is operated at 244 nm or 257 nm. The metal-containing layer may include combinations of layers of materials selected from chromium, chromium oxide, chromium oxynitride, molybdenum, molybdenum silicide, and molybdenum tungsten silicide, for example and not by way of limitation. The organic antireflection coating may be selected from a negative photoresist containing a DUV dye; a polymeric material prepared from acrylic polymers or copolymers; a binder resin combined with an acid or thermal acid generator and a photoacid generator compound; a binder resin having pendent phenyl groups; and combinations thereof.

The organic anti-reflective coating composition preferably comprises acrylic polymers and/or copolymers.

In an alternative embodiment of the method of fabricating a photomask, the organic antireflection-coating is applied over an inorganic antireflection coating. The inorganic antireflection coating may be selected to include a material such as chrome oxynitride, titanium nitride, silicon nitride or molybdenum silicide.

BRIEF DESCRIPTION OF THE DRAWINGS

FIG. 1A shows a schematic cross-sectional view of beginning structure 100 of a stack of materials used in the production of a photomask or reticle. The stack from bottom to top includes a substrate 102 which is typically selected from quartz, fluorinated quartz, borosilicate glass, or soda lime glass; a chrome-containing layer 104; an inorganic ARC layer such as chrome oxynitride, titanium nitride, silicon nitride, or molybdenum silicide 106; and a DUV photoresist layer 108.

FIG. 1B shows the FIG. 1A structure after a direct write patterning of DUV photoresist layer 108 using an e-beam writing tool. A pattern of lines and spaces has been created in a positive tone DUV photoresist layer 108. The upper portion of each line 107 exhibits a "t" top 113, has at its base a foot 110 which is in contact with the upper surface 118 of ARC layer 106, and exhibits standing waves 114 (not shown in FIG. 1B, but shown in FIG. 1C).

FIG. 1C shows an enlargement of a portion of FIG. 1B, which shows the details of line 107, including the "t" top 113, the feet 110, and ripples/standing waves 114 on the surface 112 of sidewalls 111 of line 107.

FIG. 2A shows a schematic cross-sectional view of beginning structure 200 of a stack of materials used in the production of a photomask or reticle. The stack from bottom to top includes a substrate 102 which is typically selected from quartz, fluorinated quartz, borosilicate glass, or soda lime glass; a metal-containing layer 204 which is typically selected from a chromium, molybdenum, or tungsten-containing layer, or combinations thereof. In the examples described herein, the metal-containing layer is essentially chrome; an inorganic ARC layer 205; an organic ARC layer 206; and a DUV photoresist layer 208.

FIG. 2B shows the FIG. 2A structure after a direct write continuous wave laser patterning of DUV photoresist layer 208. A pattern of lines and spaces has been created in DUV photoresist layer 208. The upper portion 210 of each line 207 does not exhibit a "t" top of the kind which was observed when the previously known patterning art was used (a "t" top 113 is shown in FIG. 1B). There is no foot at the base 212 of the line 207, where the base 212 is in contact with organic ARC layer 206. Standing waves of the kind which were observed when the previously known patterning art was used (standing wavel 14 is shown in FIG. 1B) were not observed when the present patterning method was used.

FIG. 2C shows an enlargement of a portion of FIG. 2B, which shows the details of line 207, including a well shaped upper portion 210, a clean intersection at the base 212 where line 207 intersects the surface 209 of organic ARC 206, and the absence of standing waves.

FIG. 3A shows a schematic cross-sectional view of beginning structure 300 of a stack of materials used in the production of a photomask or reticle. The stack from bottom to top includes a substrate 302 which is typically selected from quartz, fluorinated quartz, boro silicate glass, or soda lime glass; a metal-containing layer 304, which is typically selected from a chromium, molybdenum, or tungsten-containing layer, or combinations thereof. In the examples described herein, the metal-containing layer is essentially chrome; an organic ARC layer 306; and a DUV photoresist layer 308.

FIG. 3B shows the FIG. 3A structure after a direct write continuous wave laser patterning of DUV photoresist layer 308. A pattern of lines and spaces has been created in DUV photoresist layer 308. The upper portion 312 of each line 307 does not exhibit a "t" top of the kind which was observed when the previously known patterning art was used (113 as shown in FIG. 1B). There is no foot at the base 314 of the line 307, where the base 314 is in contact with organic ARC layer 308. Standing waves of the kind which were observed when the previously known patterning art was used (114 as shown in FIG. 1B) were not observed when the present patterning method was used.

FIG. 3C shows an enlargement of a portion of FIG. 3B, which shows the details of line 307, including a well shaped upper portion 312, a clean intersection at the base 314 where line 307 intersects the surface 309 of organic ARC 306, and the absence of standing waves.

DETAILED DESCRIPTION OF THE INVENTION

As a preface to the detailed description, it should be noted that, as used in this specification and the appended claims, the singular forms "a", "an", and "the" include plural referents, unless the context clearly dictates otherwise.

As mentioned in the Background Art section above, reflections from underlying materials frequently create standing waves on the surface of a patterned photoresist. Further, due to chemical reactions which take place between the photoresist and a layer underlying a positive tone photoresist, undeveloped areas may occur at the base of a patterned photoresist (these undeveloped areas are commonly referred to as a foot or as feet). As mentioned in the Background Art section, the presence of standing waves and feet on the surface of a patterned photoresist affects the critical dimensions of a semiconductor device or a photomask which is produced using the patterned photoresist to transfer a pattern into the surface of the semiconductor device or photomask.

When the photoresist is a positive tone chemically amplified photoresist, such as a positive tone DUV photoresist, the "t"-topping and standing wave problems are magnified. In addition, positive tone chemically amplified photoresists typically exhibit an increased problem in the area of foot formation. FIG. 1C illustrates a schematic of a cross-sectional view of a line 107 in a positive tone patterned photoresist 108 which exhibits "t"-topping 113, standing waves 114 on sidewall 111 surfaces 112, and feet 110 at the base.

Figure 1D:
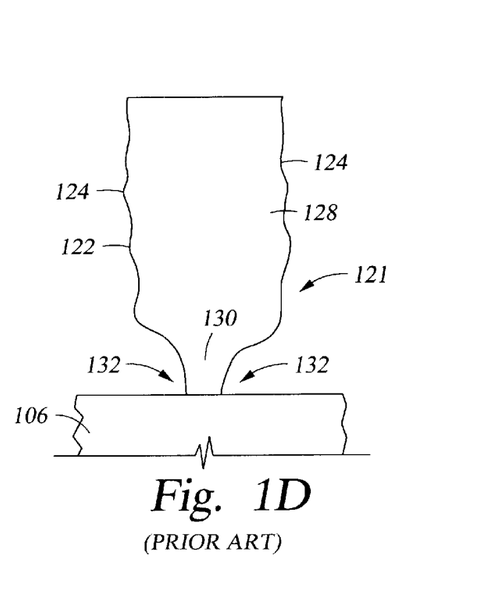
FIG. 1D shows a schematic of a cross-sectional view of a developed photoresist of the kind shown in FIG. 1C, except that the profile of the photoresist is that which would be created when a negative tone DUV photoresist layer 128 is used to produce the developed lines and spaces pattern of the kind shown in FIG. 1B. Negative tone photoresist layer 128 overlies inorganic ARC layer 106. The profile of the developed line 121 includes standing waves 124 on sidewall 122 of developed resist 128. The base 130 of the line 121 is undercut as indicated by arrows 132, to produce a line 121 which is "pinched" at its base 130.

When the photoresist is a negative tone chemically amplified photoresist, such as a negative tone DUV photoresist, the standing wave problems are significant and, in addition, negative tone chemically amplified photoresists typically exhibit a "pinching" at the base of a line pattern, as shown in FIG. 1D. FIG. 1D illustrates a schematic of a cross sectional view of a line 121 in a negative tone patterned photoresist 128 which exhibits standing waves 124 on sidewall surface 122 and a narrowing or "pinching" at the base 130 of line 121. The pinching occurs because, in a negative tone resist 128, the irradiated portion of the resist reacts (typically crosslinks) to form a polymer which is insoluble in the developing solution (during development of the pattern). Due to neutralization of a portion of the chemical reaction at the upper surface of inorganic ARC layer 106, the photoresist 128 is not sufficiently reacted at its base 130 adjacent inorganic ARC layer 106. Photoresist 128 sidewall surface 122 is undercut as indicated by arrows 132 during development of the irradiated pattern including line 121.

We have discovered a method of patterning either a positive tone or a negative tone photoresist structure overlying a photomask, which avoids or reduces the amount of "t"-topping, standing waves, and feet present on the patterned photoresist structure. This enables the patterning of the photomask in a manner which enhances critical dimension control of the patterned mask. In addition, the method enables the use of metrology after patterning of the photoresist rather than after patterning of the photomask itself, which provides considerable cost savings in the production of photomasks.

I. Apparatus for Practicing the Invention

The imaging system used to practice the method subsequently described herein is a new apparatus which may be a 244 nm or a 257 nm mask writing laser tool available from ETEC Systems Inc., Hillsboro, Oreg. This direct write continuous wave laser tool, available under the trade name ALTA™, is a raster-scan writing system. The system contains a polygon that rotates, reflecting 32 laser beams off each facet, and scans the beams (referred to as the brush) across the substrate. The writing quality specifications for the 257 nm ALTA™ mask writing laser tool include a minimum feature size of about 400 nm (enabling the user to realize features at 50% of specification, or 200 nm). The 257 nm ALTA™ mask writing laser tool provides the user with advanced feature critical dimension (CD) control, linearity, and uniformity. However, realization of the complete performance potential in the fabricated mask depends on the use of appropriate process materials and processing methods during fabrication of the mask.

Figure 4:
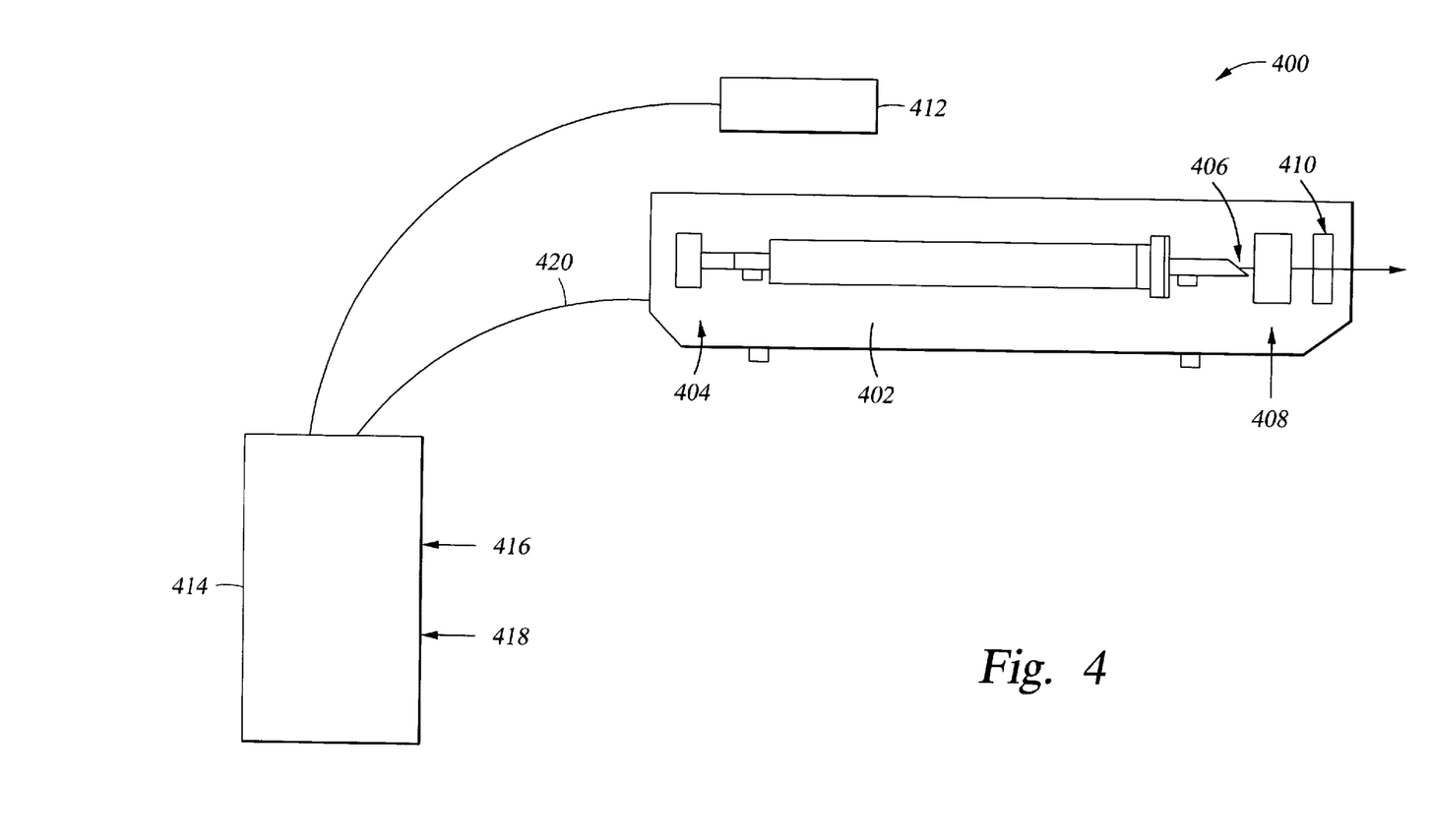
FIG. 4 shows a simplified schematic of the direct write continuous wave laser system components which were present in the tool used in the Examples which follow, to pattern a photoresist prior to transfer of the pattern to an underlying photomask.

FIG. 4 shows a simplified schematic of the direct write continuous wave laser system components which were present in the tool used to image the photoresists described in the Examples which follow. The laser system 400 included the DUV laser head 402. Laser head 402 included a high reflector 404, a Brewster window 406, an output coupler 408, and a safety shutter 410. The light source was an argon-ion gas laser that is operated at a single line (514 nm) in the fundamental mode ($TEM_{00}$). This green line is then frequency doubled via an intra-cavity beta-barium borate (BBO) crystal to produce laser light at 257 nm. Due to the physics and the geometry of the doubling process, the intensity profile of the 257 nm beam is describable by a $sinc^2$ function. The side lobes of the $sinc^2$ profile are filtered to produce a predictable near-Gaussian profile beam used for printing by the ALTA™ system.

The maximum DUV output power is approximately 1.5 W. The laser is operated at lower power levels to protect optical coatings and extend the life of the laser. The laser head 402 is mounted behind a bridge (not shown) on a granite slab (not shown). As shown in FIG. 4, a remote module 412 provides control signals to a central panel 414. Further, cooling water, indicated by arrow 416 and electrical power, indicated by arrow 418, (480 V from a power distribution center not shown) are also provided to central panel 414. A laser umbilical 420 carries water, power, and the control signals to laser head 402.

Figure 5:
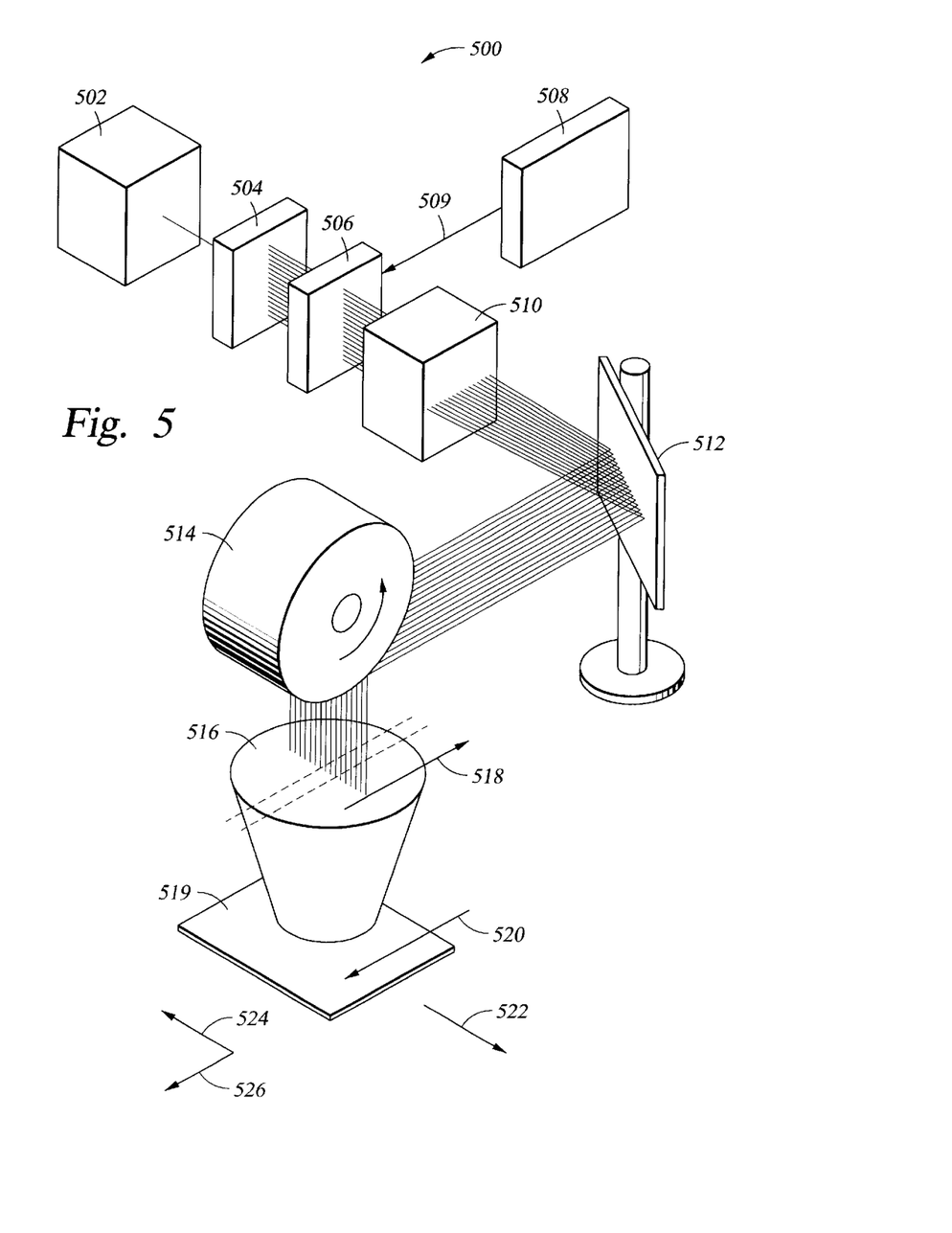
FIG. 5 shows a simplified schematic of the optical architecture of an ALTA™ 257 nm direct write continuous wave laser of the kind used in the Examples which follow, to pattern the photoresists prior to transfer of the pattern to an underlying photomask.

FIG. 5 shows a simplified schematic of the optical architecture of an ALTA™ 257 nm direct write continuous wave laser of the kind used to image photoresists in the Examples which follow. The optical architecture 500 includes a DUV laser source 502; a multiple beam splitter 504; an acousto-optic modulator 506; geometry engines, beam boards and clock boards which present in data module 508, which provides electronic pixel data 509; a K-mirror 510; a steering mirror 512; a rotating 24 facet polygon 514; a reduction lens 516 with arrow 518 indicating scan direction before the reduction lens; and the photomask substrate plate 519, with arrow 520 indicating the scan direction at plate 519, and arrow 522 indicating the direction of plate motion. Arrow 524 indicates the stripe axis, while arrow 526 indicates the scan axis. For additional information regarding the optical architecture of the ALTA™ 257 nm direct write continuous wave laser, one skilled in the art should contact ETEC Systems of Hillsboro, Oreg.

II. Method of Patternomg a Photomask

All methods of optically patterning a photomask may benefit from application of the present method. The method is particularly useful when a chemically amplified DUV photoresist is used to pattern the photomask. The present Examples are for an acrylic-based chemically amplified photoresist. However, the scope of the invention is not intended to be limited to this family of chemically amplified photoresists.

EXAMPLES

Example One

Figure 2A:
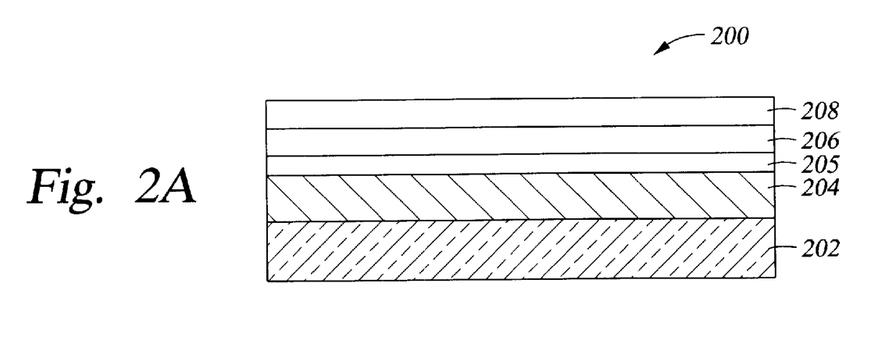
FIGS. 2A–2C illustrate one embodiment of the present invention which illustrates a method for the optical, direct write continuous wave laser patterning of a chemically amplified photoresist which produces a pattern having a cross-sectional profile which enables critical dimension control during transfer of the pattern into an underlying photomask substrate.

FIG. 2A shows a starting structure 200 used in the fabrication of a photomask, hereafter referred to as a reticle. In this Example, starting structure 200 was a stack of layers (not shown to scale) which included, from top to bottom, a 5,000 Å thick layer 208 of a chemically amplified DUV photoresist, DX1100 (available from AZ Clariant Corp. of Somerville, N.J.); a 550 Å thick layer 206 of an organic ARC identified as KRF 17G (available from AZ/Clariant); a 250 Å thick layer 205 of chromium oxynitride inorganic ARC; a 750 Å thick layer 204 of chrome mask material; and a silicon oxide-containing substrate 202.

In particular, the chemically amplified DUV photoresist, DX1100, comprises propylene glycol monomethyl ether acetate (PGMEA); PMA; 1-methoxy-2-propyl acetate; modified phenolic polymer; and an onium salt metal halide complex as a chemical amplifier. This DUV photoresist is applied in the manner described by the manufacturer. The organic ARC, KRF 17G, comprises PGMEA and modified acrylic polymer. (We have discovered that this particular organic ARC requires a post application bake after spin coating; the post application bake is carried out at 200±3° C. for a period of 7 minutes). The inorganic arc layer was chrome oxynitride, which was sputter deposited using techniques known in the art. The chrome-containing mask material was essentially chrome, and was also sputter deposited using techniques known in the art. The silicon oxide-containing substrate was quartz.

Figure 2B:
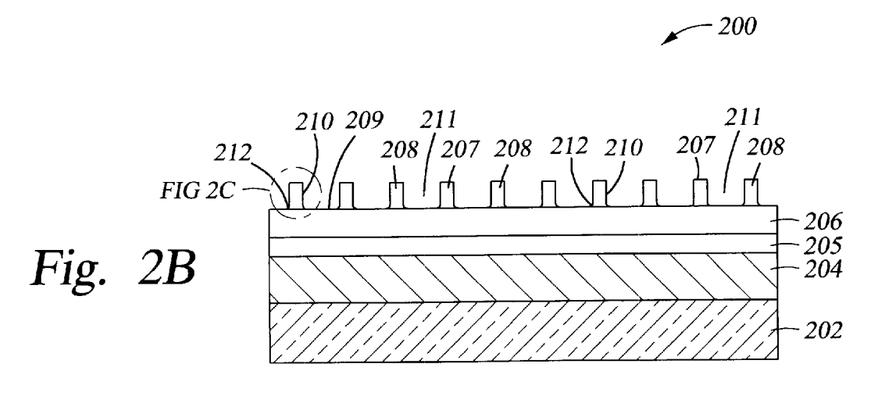

FIG. 2B shows a schematic cross-sectional view of the patterned photoresist layer 208 (prior to transfer of the pattern through underlying organic ARC layer 206, inorganic ARC layer 205, and chrome-containing layer 204), where the pattern was lines 207 and spaces 211, where the line width was about 0.30 μm and the spacing between lines was about 0.3 μm. The patterning was done using a direct write continuous wave laser, in particular, the 257 nm mask writing laser tool available from ETEC Systems, Inc., Hillsboro, Oreg., which was described above. The patterning method was as follows:

The 257 nm direct write continuous wave laser exposes (images) integrated circuit patterns onto an unpatterned photoresist 208 coated on a mask blank which includes organic ARC layer 206, inorganic ARC layer 205, chrome-containing layer 204, and quartz layer 202 as described above. The mask fabrication process transformed the latent image created by the exposure of the photoresist into a permanent chrome image on the quartz substrate.

Realization of the desired control over critical dimension (CD) of the permanent chrome image depends on use of the 257 nm ALTA™ tool in combination with appropriate photoresist and ARC materials. General requirements for producing patterned resists having features in the 0.18 μm range (and smaller) are: The CD sensitivity to optical exposure dose is preferably <3.0 nm/% dose; the CD error contribution from the mask blank is less than ±2 nm within a 132-mm×132-mm area, centered on a 6-inch×6-inch×0.25-inch quartz substrate (plate). The nominal CD should be achieved at the isofocal dose.

Nominal dose for the 257 nm ALTA™ system is equivalent to isofocal dose, which is found experimentally by identifying the dose that produces the smallest deviation from target CD through focus. Exposure of the resist should occur at the isofocal exposure, which is equivalent to tape CD in the resist. The image log-slope of the 257 nm ALTA™ system is sufficiently high that underexposure to compensate for an etch undercut puts the nominal exposure dose too close to the dose-to-clear value. The dose-to-clear is the dose which is required to ensure that the entire thickness of the photoresist will be developed in the exposed areas. Typically, nominal dose is dose-to-clear ($E_0$) plus 50% for adequate process latitude. It is an advantage to have the nominal dose be equivalent to the isofocal dose, as the ultimate critical dimension will be to size. The only compensation required for variance from critical dimension is for purposes of correcting pattern etch bias, and this is done by feeding experimental size data after etch into the data handling computer of the ALTA™ Imaging system, where the features may be scaled as needed.

The latent image stability in the photoresist should be such that there is less than a 5 nm change in the CD over a 6 hour time period. When the patterned photoresist is used to transfer the pattern to the underlying chrome-containing layer 204 using a low substrate bias dry etch process, the single-edge profile (cross-sectional view of the etched chrome-containing line) should exhibit an undercut of less than 10 nm. To accomplish the desired control, the DUV photoresist should be a modern, high-contrast resist, sensitive ($\leq 30$ mJ/cm$^2$) at 257 nm.

The substrate 202 used for mask fabrication met the requirements shown in Table I below.

TABLE I

| Physical Property | | Condition | Quartz Mask Blank |
|---|---|---|---|
| Composition | | | 100% SiO$_2$ |
| Thermal | Expansion | Coefficient ($\alpha_{50}$ –200° C. × 10$^{-7}$) | 5 |
| Thermal | Annealing Point | | 1.120° C. |
| Optical Properties | Refractive Index | | 1.46 n$_d$ |
| Chemical Durabilities | Weight Loss | Deionized (DI) water, 100° C., 1 hour | 0.000% |
| | | 1/100 N HNO$_3$, 100° C., 1 hour | 0.000% |
| | | 5% NaOH, 80° C., 1 hour | 0.17 mg/mm$^2$ |

In addition, the quartz substrate had the following physical properties: a Young modulus of 7.413 kg/mm$^2$; a sheer modulus of 3,170 kg/mm$^2$; a Poisson ratio of 0.18; a Knoop hardness of 615 kg/mm$^2$; and a Lapping hardness of 210 kg/mm$^2$. The electrical properties included a surface resistivity of 1×10$^{19}$Ω/square and bulk resistivity of 1×10$^{18}$ Ω/square.

The antireflective properties of the organic ARC layer 206 (deposited over the chrome layer 204) were as follows in Table II, below:

TABLE II

| Physical Property | Condition | Antireflective Properties at Organic BARC Surface Blank |
|---|---|---|
| Reflectivity | 257 nm | <0.5% |
| Film thickness | optical, N & K tool | 540 Å |
| Dry etch time (for removal) | oxygen plasma dry etch* | ~30 sec. |

*Dry etching conditions: plate size, 5 inch; appratus, a CENTURA™ DPS® Plasma Etch System available from Applied Materials,Inc., Santa Clara Calif. The etch chamber was evacuated to provide a chamber pressure of about 5 mTorr under etch operating conditions. A plasma source gas of oxygen was fed into the etch chamber at at flow rate of about 17 sccm; RF power was applied to a cathode beneath the reticle plate; approximately 125 Watts was applied a frequency of 13.56 MHz, to produce and maintain an oxygen-comprising plasma over the surface of reticle plate, and to provide a DC bias of about −340 to −410 Volts on the surface of the reticle plate. The temperature of the reticle plate was about 25° C. and the temperature of the etch chamber 400 walls was about 40° C.

The AZ DX1100P photoresist thickness should correspond to the maximum on the CD swing curve to minimize CD uniformity errors that are due to resist thickness variation. It is recommended that the maximum photoresist thickness be about 5,000 Å. The minimum photoresist thickness is about 3,000 Å to avoid pinhole defects after dry etching (because of the expected 1000 Å–1500 Å resist film loss associated with the etch process). The photoresist is applied by spin coating techniques known in the art. The post application bake (PAB) of the photoresist is critical for obtaining acceptable CD uniformity performance. The resist dissolution rate depends on bake temperature variations across the mask blank, which result in dissolution rate nonuniformity. The AZ DX-1100P resist shows a CD sensitivity of <1.0 nm/° C. to PAB temperature when hotplate-baked at 105° C. with a maximum variation of ≦2.5° C. during thermal ramp up and cool-down. The specified PAB temperatures refer to the temperature of the resist on top of the photomask and not to the hotplate setpoint itself. The offset between these values depends on the equipment used and may be determined by experimentation. The effect of PAB on CD increases significantly when PAB temperatures increase considerably above about 110° C. Therefore, the PAB used was a bake at 105° C. for 7 minutes, with a bake process that results in temperature variations of less than (<)0.5° C. at the mask blank surface at steady state. The specification for the photoresist applied over the organic ARC on the mask blank was as follows. The film thickness (swing maximum) was 4,975 Å. The uniformity over the substrate surface was ±40 Å. The mean thickness range from substrate plate to substrate plate was 100 Å. The post-apply bake (PAB) temperature variation was <0.5° C.

The 257 nm ALTA™ optical imaging system in combination with the AZ DX-1100P photoresist provides 0.20 μm or better resolution and low iso/dense bias on packed pitch lines. The 257 nm ALTA™ system uses special filters designed to remove organic and inorganic basic contaminants (amines, ammonia, for example) from air in the exposure chamber, which could compromise the resist performance. Prior to exposure, the mask blanks were kept in light-tight bags and in non-outgassing boxes equipped with an integrated sealing gasket. Additionally, after imaging, the exposed mask structures (plates) were processed in a clean room area that met the environmental requirements specified in the 257 nm ALTA™ Facility Planning Manual.

After exposure (imaging) of the photoresist, the imaged resist was post exposure baked (PEB). Chemically amplified DUV photoresists require a post-exposure bake to uniformly diffuse the photogenerated acid within the exposed regions, and to complete the chemical transformations within these regions that affect differential solubility. As temperature gradients have a material impact on the resultant CD uniformity, hot plate uniformity during the PEB was controlled to ±1.5° C. during ramp up and ramp down of a 70° C. steady state, and controlled to ±1.5° C. at setpoint in the resist, over a 132-mm×132-mm area on a 6-inch×6-inch× 0.250-inch substrate.

The photoresist was developed using a spin/spray process with an AZ 300 MIF developer. This developer is a 2.38 wt % solution of tetramethyl ammonium hydroxide (TMAH). The development time was about 60 seconds. The goal is to place a large amount of developer on the plate, creating an in situ puddle process with constant replenishment. The more rapidly this step is accomplished, the more uniformity is achieved in the resultant CDs. A low spin speed, approximately 100 rpm, is optimal for initial wetting on the plate, while still permitting uniform agitation due to the rotation of the plate through the nozzle path. The rotation was maintained during developer dispense and then reduced to approximately 15 rpm throughout the puddle duration. Prior to rinsing with $CO_2$-sparged, deionized water, the remaining developer should be spun-off at approximately 1000 rpm for 5 seconds. At this time, 5 seconds of spray develop was started without altering the 1000 rpm rotational rate. Concurrent with cessation of develop dispense, $CO_2$-sparged or $CO_2$-reionized water was dispensed for approximately 30 seconds at about 300 rpm for the first 15 seconds and at 1,500 rpm for the remaining 15 seconds. Further rinse via spray-puddle was commenced, followed by a spin-dry step of approximately 90–120 seconds at 2,000–2,500 rpm.

The pattern in the photoresist was then transferred to the underlying photomask structure using a dry etch process. The substrate was etched in a high density plasma under conditions that reduced mean-to-target deviation, while still maintaining good CD uniformity. The plasma etch was performed in an inductively coupled plasma (ICP) etch tool using a three step process: descum/organic ARC (BARC) removal; chrome oxynitride (inorganic ARC)/chrome etch; and overetch.

Plasma etch systems such as the Applied Materials, Inc. CENTURA® DPS™ etch system (available from Applied Materials, Inc. , of Santa Clara, Calif.) may be used to provide excellent results. A plasma processing system which permits separate power application for plasma generation and for substrate biasing is commonly referred to as a Decoupled Plasma Source (DPS). Substrate biasing is used to attract ions and other high energy species from the plasma toward the substrate surface, enabling anisotropic etching. Separate application of power for plasma generation and power for substrate biasing permits separate control of the plasma density and the attractive forces (DC voltage) generated on the surface of the substrate.

A description of an apparatus including a Decoupled Plasma Source (DPS) is provided by Yan Ye et al. from the Proceedings of the Eleventh International Symposium of Plasma Processing (May 7, 1996), which was published in the Electrochemical Society Proceedings (Volume 96–12, pp. 222–233, 1996), which is hereby incorporated by reference. U.S. Pat. No. 5,753,044, issued to Hanawa et al. on May 19, 1998, contains a general description of an RF plasma reactor of the kind which permits separate power application and control for plasma generation and maintenance and for substrate biasing, by way of example and not by way of limitation.

The descum/organic ARC (BARC) removal step of the three step etch process removes any residual photoresist remaining on open areas after development, and removes the organic ARC (BARC) layer from the open areas. This is accomplished using an oxygen plasma. A DC bias is applied to the substrate during the descum/BARC removal step to accelerate oxygen ions from the plasma so that they impinge upon the reticle surface with high kinetic energy and directionality, normal to the reticle surface. This is accomplished using oxygen gas and by powering only the lower electrode (upon which the reticle plate rests), creating a capacitively coupled plasma with a high DC bias between the plasma and the reticle. Typically the process is carried out in a process chamber at a pressure of about 3 mTorr to about 8 mTorr. As described above, a plasma source gas of oxygen was fed into the processing chamber at a flow rate of about 17 sccm. RF power of about 125 W at a frequency of 13.56 MHz was applied to the lower electrode (cathode). This provided a DC bias of about −340 to about −410 Volts on the photomask substrate surface, while providing an oxygen plasma over the reticle surface. The temperature of the reticle plate was in the range of 25° C., with a chamber wall temperature in the range of 40 ° C. The descum/organic ARC (BARC) removal time was about 30 seconds. The photoresist loss due to the descum/organic ARC (BARC) removal process is about 750 Å.

The chrome oxynitride (inorganic ARC)/chrome mask layer etch was done using a plasma generated from a chlorine-oxygen-helium gas mixture. The molecular ratio of the chlorine:oxygen:helium gas mixture was about 50:10:22. The total gas flow rate was about 82 sccm. The ICP coil was powered to about 60 W at 2 MHz to generate a high density plasma. The lower electrode was powered to about 5 W at about 13.56 MHz, to generate a DC voltage of about −50 V on the substrate. The temperature of the reticle plate was about 25° C., while the wall temperature of the process chamber was about 40° C. The etch end point was detected by optical reflectance, and occurred in about 200 seconds. Typically, higher oxygen concentrations and lower pressures cause higher mean-to-target deviation and lower selectivities, while favoring better CD uniformity. One skilled in the art can optimize the process for his/her particular apparatus.

Typically the chrome layer is overetched beyond endpoint to clear residual chrome from all open regions. Generally the overetch step is an extension of the chrome etch process described above. Longer overetch steps result in higher mean-to-target deviations. Chrome spot defect densities can be affected by the length of overetch, with lower defect densities for longer overetch processes.

After completion of the chrome layer etch, a strip and clean process is performed to remove any residual contaminants from the surface of the chrome layer. The strip chemical used was sulfuric peroxide which was heated to about 75° C. and applied over the surface of the substrate plate. After treatment with sulfuric peroxide, the substrate plate is rinsed with $CO_2$-reionized, or $CO_2$-sparged deionized water. After strip, the substrate plate was subjected to an acid clean using an industry standard 70:30 $H_2SO_4/H_2O_2$ solution, followed by another deionized water rinse. The strip step was performed on a Steag ASC 500 wet chemical processing station available from STEAG-HAMMATECH®, Santa Clara, Calif.

Figure 2C:
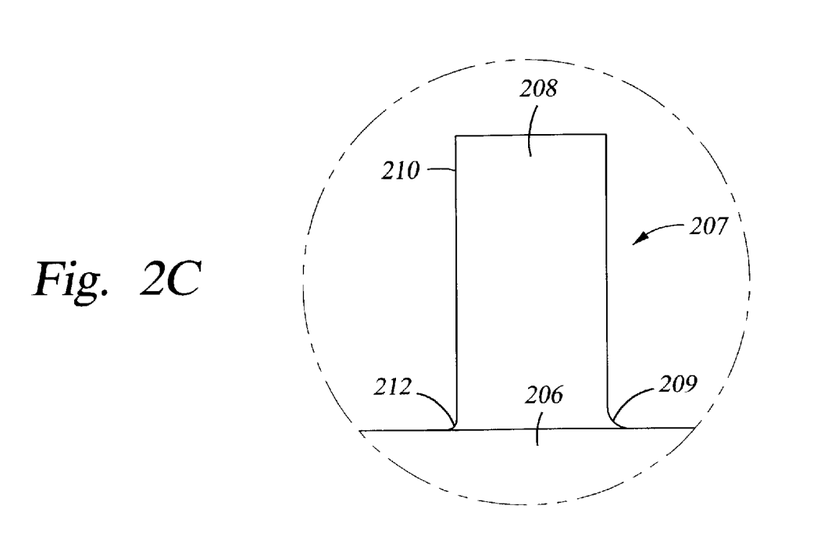

FIG. 2C shows a close-up of a typical line 207 of a patterned photoresist layer 208 obtained using the combination of the 257 nm ALTA™ optical imaging tool, the DX1100 DUV photoresist 208, the KRF 17G organic ARC 206, a chrome oxynitride inorganic ARC 205, and a chrome mask layer 204. The advantage in using both an organic ARC layer 206 and an inorganic ARC layer 205 is that resolution is improved. Using this mask fabrication method, reticles with features having a critical dimension of 200 nm have been created. For a 132-mm×132-mm (6-inch) active area, the critical dimension uniformity (CD Range/2) is typically ≦10 nm at 400 nm.

Example Two

Figure 3A:
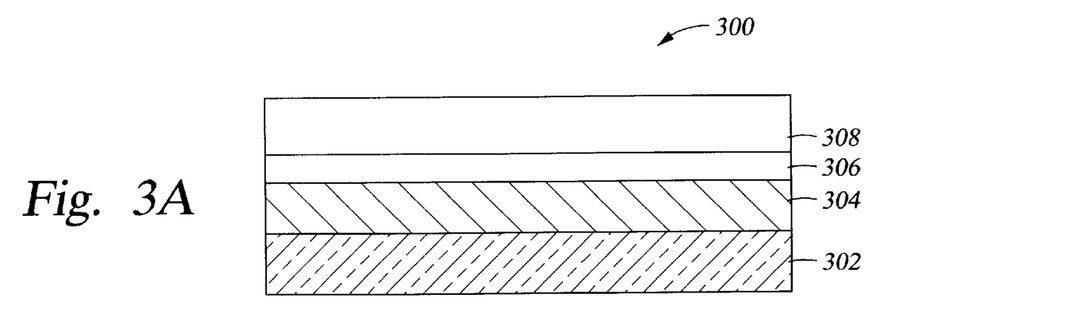
FIGS. 3A–3C illustrate a second embodiment of the present invention which illustrates a method for the direct writing continuous wave laser patterning of a chemically amplified photoresist which produces a pattern having a cross-sectional profile which enables critical dimension control during transfer of the pattern into an underlying photomask substrate.

FIG. 3A shows a starting structure 300 used in the fabrication of a photomask (reticle). In this Example, starting structure 300 is a stack of layers which included, from top to bottom, a 5,000 Å thick layer 308 of the chemically amplified DUV photoresist, DX1100; a 540 Å thick layer 306 of the organic ARC KRF 17G; a 750 Å thick layer 304 of a mask material which is essentially chrome; and a silicon oxide-containing substrate 302.

Figure 3B:
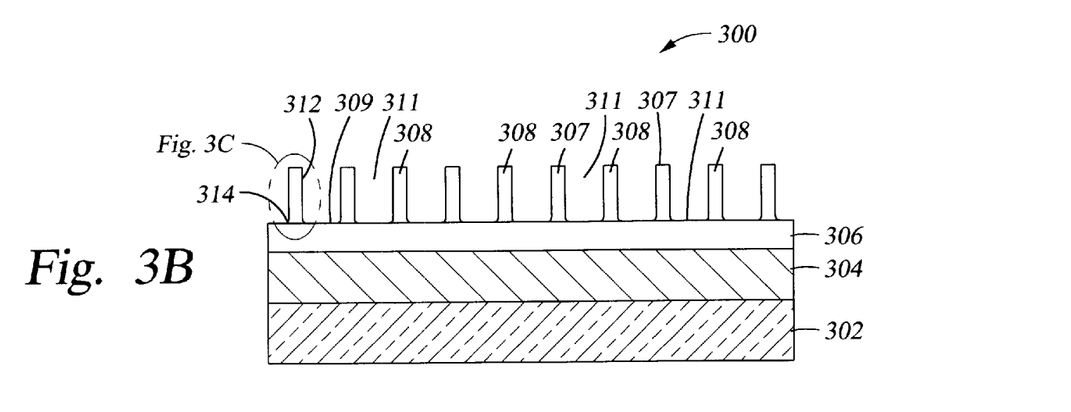

FIG. 3B shows a schematic cross-sectional view of the patterned photoresist layer 308 (prior to transfer of the pattern through underlying organic ARC layer 306, and chrome-containing layer 304), where the pattern is lines 307 and spaces 311, where the line width is about 0.30 μm and the spacing between lines is about 0.3 μm. The patterning is done using the direct write continuous wave laser, in particular, the 257 nm mask writing laser tool available from ETEC Systems which was described above. The patterning method is as described previously for the photoresist imaging. The isofocal dosage may need to be adjusted slightly, depending on the organic ARC layer thickness, but this may be determined by minimal experimentation.

After exposure (imaging) of the photoresist, the imaged resist is post exposure baked (PEB) and developed as previously described.

The pattern in the photoresist is then transferred to the underlying photomask structure using a dry etch process using the apparatus previously described.

The descum/organic ARC (BARC) removal step is performed as described with reference to Example One.

The chrome layer etch and strip and clean process are carried out in the manner described in Example One.

Figure 3C:
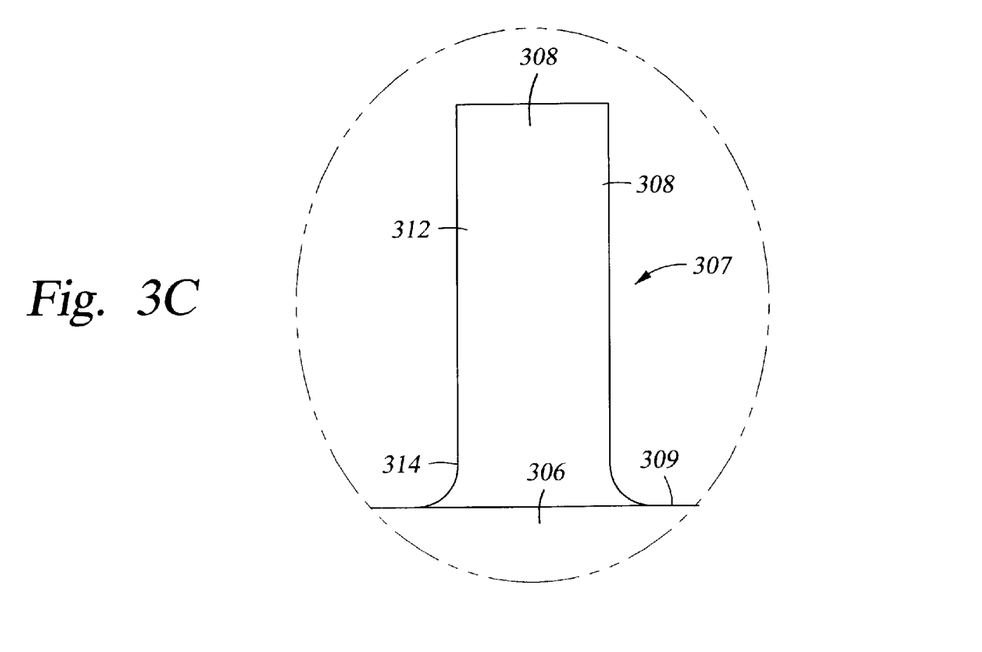

FIG. 3C shows a close-up of a typical line 307 of a patterned photoresist layer 308 obtained using the combination of the 257 nm ALTA™ optical imaging tool, the DX1100 DUV photoresist 308, the KRF 17G organic ARC 306, and a chrome mask layer 304. Using this mask fabrication method, reticles with features having a critical dimension of 200 nm have been created. For a 132-mm×132-mm (6-inch) active area, the critical dimension uniformity (CD Range/2) is typically <10 nm at 400 nm.

With respect to Example One or Example Two, metrology may be carried out after patterning of the photoresist, or may be carried out after the pattern has been transferred through the chrome-containing masking layer. Conducting the metrology after patterning oft photoresist assists in providing better resolution, as etch conditions used in subsequent pattern transfer can be adjusted to provide better resolution. In instances where the photoresist pattern is defective, the significant cost of transferring a defective pattern from a patterned photoresist through several underlying layers can be avoided by conducting metrology after patterning of the photoresist.

By using an organic ARC rather than an inorganic ARC, or an organic ARC over the surface of an inorganic ARC, the chemical reaction at the base of the photoresist is eliminated, so that a foot is not produced at the base of the patterned resist. This is particularly helpful in enabling metrology after patterning of the photoresist rather than after the chrome-containing mask is patterned. As described above, this provides a substantial savings in the manufacture of reticles, as the metrology can be used to determine where in the integrated process dimensional error occurs, indicating which process step variables require adjustment to enable the production of a satisfactory reticle. Further, the metrology may also be used to determine which reticles are defective after photoresist patterning, so that these reticles may be discarded without the investment of further processing time and materials. Finally, possibly even more valuable is the improved resolution in the patterned mask itself when the pattern distortions in the photoresist are removed.

The above described preferred embodiments are not intended to limit the scope of the present invention, as one skilled in the art can, in view of the present disclosure, expand such embodiments to correspond with the subject matter of the invention claimed below.

We claim:

1. A method of optically patterning a photomask using a direct write continuous wave laser, comprising:
    a) applying an organic antireflection coating over a metal-containing layer;
    b) applying a chemically-amplified positive tone or negative tone DUV photoresist over said organic antireflection coating; and
    c) exposing a surface of said DUV photoresist to radiation from said direct write continuous wave laser.

2. The method of claim 1, wherein said organic antireflective coating contains a material selected from the group consisting of a negative photoresist containing a DUV dye, a polymeric material prepared from acrylic polymers or copolymers, a binder resin combined with an acid or thermal acid generator and a photoacid generator compound, a binder resin having pendant phenyl groups, and combinations thereof.

3. The method of claim 2, wherein said organic antireflective coating includes a material selected from the group consisting of hydroxyalkyl acrylate or methacrylate, hydroxycycloalkyl acrylate or methacrylate, hydroxyalkyl-cycloalkyl acrylate or methacrylate, glycidyl methacrylate, and combinations thereof.

4. The method of claim 1, wherein said chemically-amplified DUV photoresist contains an onium salt metal halide complex.

5. The method of claim 1, or claim 2, or claim 3, or claim 4, wherein said direct write continuous wave laser operates at a wavelength of 244 nm or 257 nm.

6. The method of claim 5, wherein said wavelength is 257 nm.

7. A method of optically patterning a photomask using a direct write continuous wave laser, comprising:
    a) applying or creating an inorganic antireflection coating over a metal-containing layer;
    b) applying an organic antireflection coating over said inorganic antireflection coating;
    c) applying a chemically-amplified positive tone or negative tone DUV photoresist over said organic antireflection coating; and
    c) exposing a surface of said DUV photoresist to radiation from said direct write continuous wave laser.

8. The method of claim 7, wherein said inorganic antireflection coating is selected from the group consisting of chrome oxynitride, titanium nitride, silicon nitride, molybdenum silicide, and combinations thereof.

9. The method of claim 7, wherein said organic antireflective coating contains a material selected from the group consisting of a negative photoresist containing a DUV dye, a polymeric material prepared from acrylic polymers or copolymers, a binder resin combined with an acid or thermal acid generator and a photoacid generator compound, a binder resin having pendant phenyl groups, and combinations thereof.

10. The method of claim 9, wherein said organic antireflective coating includes a material selected from the group consisting of hydroxyalkyl acrylate or methacrylate, hydroxycycloalkyl acrylate or methacrylate, hydroxyalkyl-cycloalkyl acrylate or methacrylate, glycidyl methacrylate, and combinations thereof.

11. The method of claim 7, wherein said chemically-amplified DUV photoresist contains an onium salt metal halide complex.

12. The method of claim 7, or claim 8, or claim 9, or claim 10, wherein said direct write continuous wave laser operates at a wavelength of 244 nm or 257 nm.

13. The method of claim 12, wherein said wavelength is 257 nm.

* * * * *